(12) United States Patent
Song

(10) Patent No.: US 8,736,510 B2
(45) Date of Patent: May 27, 2014

(54) IMPEDANCE MATCHING METHOD, IMPEDANCE MATCHING APPARATUS FOR THE SAME, AND RECORD MEDIUM

(75) Inventor: Ju Young Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 351 days.

(21) Appl. No.: 13/197,415

(22) Filed: Aug. 3, 2011

(65) Prior Publication Data

US 2012/0038523 A1  Feb. 16, 2012

(30) Foreign Application Priority Data

Aug. 11, 2010 (KR) .................. 10-2010-0077136

(51) Int. Cl.
*H01Q 1/50* (2006.01)
(52) U.S. Cl.
USPC .......................................... 343/860; 343/850
(58) Field of Classification Search
USPC ................. 343/703, 850, 852, 860
See application file for complete search history.

(56) References Cited

U.S. PATENT DOCUMENTS

| | | | | |
|---|---|---|---|---|
| 5,602,558 A | * | 2/1997 | Urakami et al. | 343/850 |
| 5,874,926 A | * | 2/1999 | Tsuru et al. | 343/860 |
| 7,109,944 B2 | * | 9/2006 | Sato et al. | 343/860 |
| 7,812,781 B2 | * | 10/2010 | Kato | 343/860 |
| 7,982,683 B2 | * | 7/2011 | Peyla et al. | 343/860 |

* cited by examiner

*Primary Examiner* — Tho G Phan
(74) *Attorney, Agent, or Firm* — Saliwanchik, Lloyd & Eisenschenk, P.A.

(57) ABSTRACT

Disclosed are an impedance matching method, an impedance matching apparatus for the same, and a record medium. The impedance matching apparatus includes a storage part to store information about an impedance matching point according a state of an obstacle, an impedance matching part connected to an antenna and including at least one variable element, a detector to detect transmit power and reflected power reflected by the antenna, and a controller to search for an impedance matching point within a variation range of the variable element by using at least one of the transmit power and the reflected power, and to detect a state of a surrounding obstacle by comparing information about the searched impedance matching point with the stored information about the impedance matching point.

20 Claims, 8 Drawing Sheets

IMPEDANCE MATCHING METHOD, IMPEDANCE MATCHING APPARATUS FOR THE SAME, AND RECORD MEDIUM

CROSS-REFERENCE TO RELATED APPLICATION

This application claims the benefit under 35 U.S.C. §119 of Korean Patent Application No. 10-2010-0077136, filed on Aug. 11, 2010, which is hereby incorporated by reference in its entirety.

BACKGROUND

An antenna circuit of a mobile communication terminal allows an antenna to transmit or receive predetermined radio signals. In order to optimize the transmit/receive radiation performance of the antenna, impedance matching must be exactly performed. Therefore, the antenna circuit includes capacitors and inductors, and the impedance of the antenna is matched in the optimal status by adjusting values of the capacitors and the inductors.

In general, the impedance matching of the antenna is achieved in a state that the mobile communication terminal is positioned in a free space.

Meanwhile, the mobile communication terminal may be used by a user in a state that the user grips the body of the mobile communication terminal with the hand of the user and adheres a speaker to the ear of the user due to the mechanical characteristic of the mobile communication terminal, or may be used by the user through an ear-phone in a state that the body of the mobile communication terminal is put into a pocket or a bag of the user.

As the user uses the mobile communication terminal by gripping the mobile communication terminal with the hand of the user and adhering the speaker to the ear of the user, or as the user uses the mobile communication terminal put into the pocket or the bag, the conditions for the impedance matching of the antenna may vary, so that the transmit/receive radiation performance of the antenna subject to impedance matching in the free space may be degraded.

Therefore, the mobile communication terminal employs an adaptive tuning antenna circuit to automatically adjust the impedance of the antenna when the conditions for the impedance matching of the antenna vary, so that the antenna has the optimal transmit/receive radiation performance.

BRIEF SUMMARY

The embodiment provides an adaptive tuning antenna circuit capable of detecting the existence of an obstacle and the position of the obstacle.

The technical objects of the present embodiment are not limited to the above object, and other technical objects will be clearly understood by those skilled in the art to which the embodiment suggested in the following description pertains.

According to the embodiment, there is provided an impedance matching apparatus including a storage part to store information about an impedance matching point according a state of an obstacle, an impedance matching part connected to an antenna and including at least one variable element, a detector to detect transmit power and reflected power reflected by the antenna, and a controller to search for an impedance matching point within a variation range of the variable element by using at least one of the transmit power and the reflected power, and to detect a state of a surrounding obstacle by comparing information about the searched impedance matching point with the stored information about the impedance matching point.

According to the embodiment, there is provided an impedance matching method of an impedance matching apparatus including a variable capacitor connected to an antenna. The impedance matching method includes detecting transmit power and reflected power reflected by the antenna, searching for an impedance matching point of the variable capacitor by using at least one of the transmit power and the reflected power, comparing information about the searched impedance matching point with previously stored information about an impedance matching point according to a state of an obstacle, and determining a state of an obstacle positioned around the impedance matching apparatus according to the comparison result.

According to the embodiment, there is provided a computer-readable record medium storing an impedance matching method and recording a program to execute the impedance matching method of an impedance matching apparatus including at least one variable capacitor on a computer. The impedance matching method includes detecting transmit power and reflected power reflected by the antenna, searching for an impedance matching point of the variable capacitor by using at least one of the transmit power and the reflected power, comparing information about the searched impedance matching point with previously stored information about an impedance matching point according to a state of an obstacle, and determining a state of an obstacle positioned around the impedance matching apparatus according to the comparison result.

DETAILED DESCRIPTION

Detailed description about well known functions or configurations may make the subject matter of the disclosure unclear. Accordingly, hereinafter, description will be made regarding only essential components directly related to the technical scope of the disclosure. In addition, terminologies to be described are defined based on functions of components according to the embodiment, and may have meanings varying according to the intentions of a user or an operator and customers. Accordingly, the terminologies should be defined based on the whole context throughout the present specification.

The embodiment provides a method for processing impedance matching at a high speed in an impedance matching apparatus.

Hereinafter, the embodiment will be described with reference to accompanying drawings.

Figure 1:
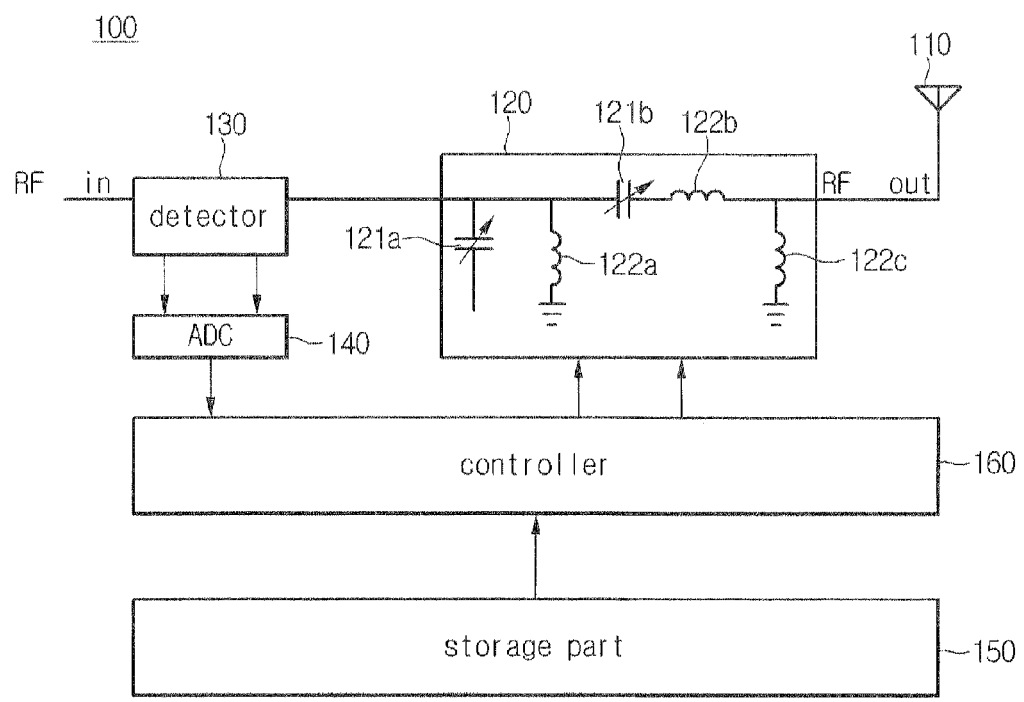
FIG. 1 is a circuit diagram showing an impedance matching apparatus according to the embodiment.

FIG. 1 is a circuit diagram showing an impedance matching apparatus 100 according to the embodiment. FIGS. 2 to 6 are views used to explain an impedance matching method according to the embodiment.

Referring to FIG. 1, the impedance matching apparatus 100 includes an antenna 110, which transmits or receives a radio wave, an impedance matching part 120 connected to the antenna 110, which transmits or receives the radio wave, a detector 130 to detect transmit power and power reflected from an antenna stage, an analogue/digital converter (ADC) 140 to convert an analog signal detected by the detector 130 into a digital signal, a storage part 150 to store information about impedance matching points according to the status of an obstacle, and a controller 160 to search for an impedance matching point based on the transmit power and the reflected power received therein from the ADC 140 and detect the status of a surrounding obstacle existing in a present state by comparing information about the impedance matching point, which has been searched, and stored impedance matching point information.

In addition, the impedance matching part 120 includes a parallel capacitor 121a connected to the antenna 110 in parallel, a series-capacitor 121b connected to the antenna 110 in series, and inductors 122a, 122b, and 122c.

Hereinafter, the impedance matching apparatus having the above structure will be described in more detail.

The impedance matching part 120 may include a plurality of variable capacitors 121a and 121b and a plurality of fixed inductors 122a, 122b, and 122c. The number of the wires of the variable capacitors 121a and 121b and the fixing inductors 122a, 122b, and 122c and the number of the above elements may vary according to embodiments. The variable capacitors 121a and 121b and the fixing inductors 122a, 122b, and 122c form impedance of an appliance equipped with the impedance matching apparatus 100.

The capacitance values of the variable capacitors 121a and 121b vary depending on the DC voltage applied thereto from the controller 160, and the intensity of the reflected power for a transmit signal vary depending on the changed capacitance value of the variable capacitors 121a and 121b. In this case, if the intensity of the reflected power is increased, impedance matching is not achieved. As the intensity of the reflected power is reduced, impedance matching is excellently achieved. In other words, the reflective coefficient (r), which is one of indexes representing the performance of an antenna, is calculated by using the difference (Return Loss, hereinafter, referred to as RL) between the transmit power and the reflected power. As the RL is increased, the impedance matching is excellently achieved. As the RL is reduced, the impedance matching is not achieved.

In this case, the impedance matching point includes the capacitance values for the variable capacitors 121a and 121b when the impedance matching is excellently achieved.

Meanwhile, although the variable capacitors 121a and 121b include one parallel capacitor 121a and one series-capacitor 121b according to the present embodiment, the embodiments are limited thereto. In other words, only the parallel capacitor 221a or only the series-capacitor 121b may be provided, or at least three variable capacitors may be provided.

The detector 130 measures the intensity of the transmit power and the intensity of the reflected power obtained by reflecting a signal input to the impedance matching apparatus 100 by the stage of the antenna 110. In this case, the detector 130 may further include a directional coupler.

In other words, the detector 130 is connected to one end of the directional coupler to detect the intensity of the transmit power, and is connected to an opposite end of the directional coupler to detect the intensity of the reflected power.

The controller 160 applies control signals to the variable capacitors 121a and 121b based on the transmit power and the reflected power to change the impedance value of the impedance matching part 120, thereby performing impedance matching.

In addition, the controller 160 searches for the optimal capacitance value (the impedance matching point), that is, the tuned capacitance value while applying the control signal to the variable capacitors 121a and 121b to change the capacitance values thereof. The controller 160 applies the tuned capacitance value to the impedance matching part 120, so that the impedance matching can be achieved.

In this case, the storage part 150 has information about impedance matching points according to the states of obstacles. The information about the impedance matching points according to the states of the obstacles includes information about an impedance matching point in which impedance is optimally matched in an air state and information about impedance matching points in which impedance is optimally matched in the existence of obstacles.

The information about the impedance matching points at which impedance is optimally matched in the existence of obstacles includes information about impedance matching points when obstacles exist at first to fourth positions.

In this case, the first to fourth positions may include positions in left, right, up, and down directions about the impedance matching apparatus 100. Although the embodiment has been described in that obstacles are positioned in four directions, obstacles may be positioned in many more directions, and information about more many impedance matching points may be stored according to another embodiment.

In addition, the information about impedance matching points in the existence of obstacles includes the information about the size of regions in which the impedance matching points are formed according to the distances from the obstacles.

The controller 160 detects the existence of an obstacle around the impedance matching apparatus 100, the position of the obstacle, and the approaching degree of the obstacle based on the information about impedance matching points according to the states of the obstacles stored in the storage part 150.

Hereinafter, a method for detecting the existence of the obstacle, the position of the obstacle, and the approaching degree of the obstacle will be described in more detail.

Figure 2:
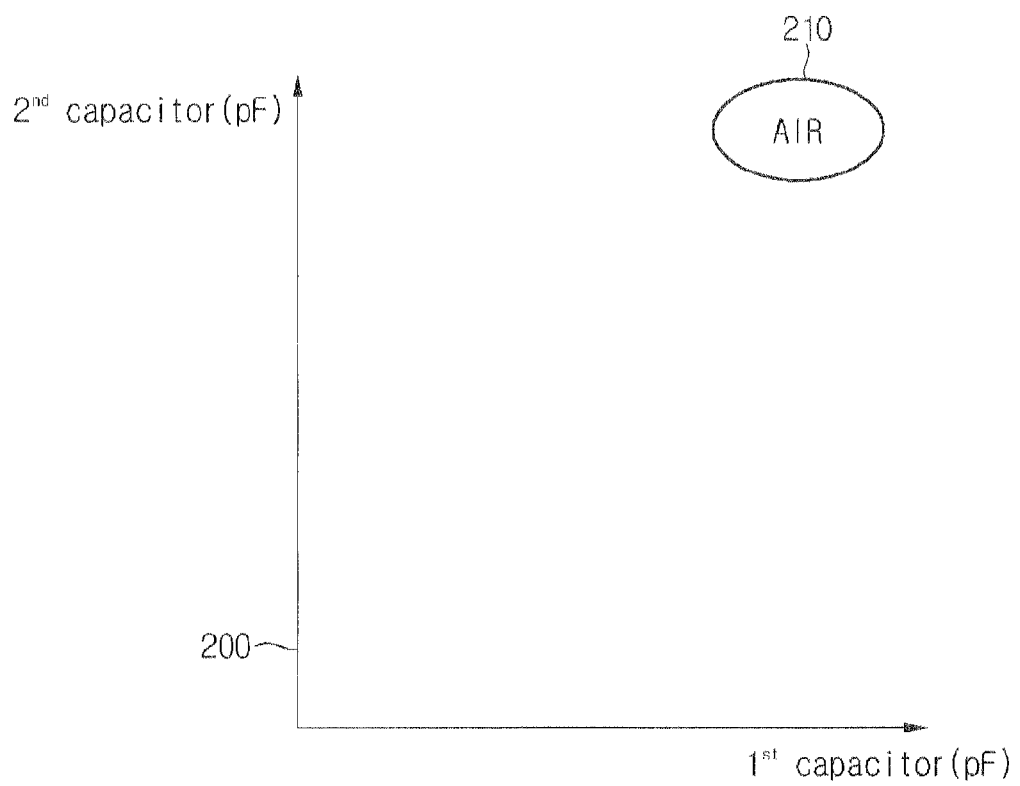
FIGS. 2 to 6 are views used to explain an impedance matching method according to the embodiment.

FIG. 2 is a view showing an impedance matching point in an air state according to the embodiment.

First, the information about impedance matching points according to the states of obstacles stored in the storage part 150 includes the information about the impedance matching point in the air state as shown in FIG. 2.

The air state refers to a free space state in which no obstacle exist around the impedance matching apparatus 100.

In other words, a surrounding environment is set to an air state, and thus an impedance matching point is searched so that impedance matching can be exactly performed in the air state.

As shown in FIG. 2, the impedance matching point in the air state is formed in a first region 210 within a variation range 200 of variable capacitors shown in FIG. 2.

In the variation range 200 of the variable capacitors shown in FIG. 2, an X axis represents capacitance values of a first variable capacitor, and a Y axis represents a capacitance value of a second variable capacitor.

If the impedance matching point is determined in the air state as described above, the information about the first region 210 corresponding to the determined impedance matching point is stored in the storage part 150.

In this case, the impedance matching point is affected by the intensity of the reflected power. As the intensity of the reflected power is reduced, impedance matching is excellently achieved. Accordingly, this point representing less reflected power may be the impedance matching point. In other words, the impedance matching point is a point satisfying at least one condition. According to the condition, the impedance matching point must include at least one of a point representing the maximum intensity of the transmit power, a point representing the maximum difference between the transmit power and the reflected power, a point representing the minimum intensity of the reflected power, and a point representing the maximum ratio of the reflected power to the transmit power. The variation range of the variable capacitor refers to a region in which a searching operation for impedance matching is performed, and the searching operation refers to an operation of detecting the intensities of the transmit power and the reflected power by sequentially applying the values of the first and second capacitors existing in the variation range.

Figure 3:
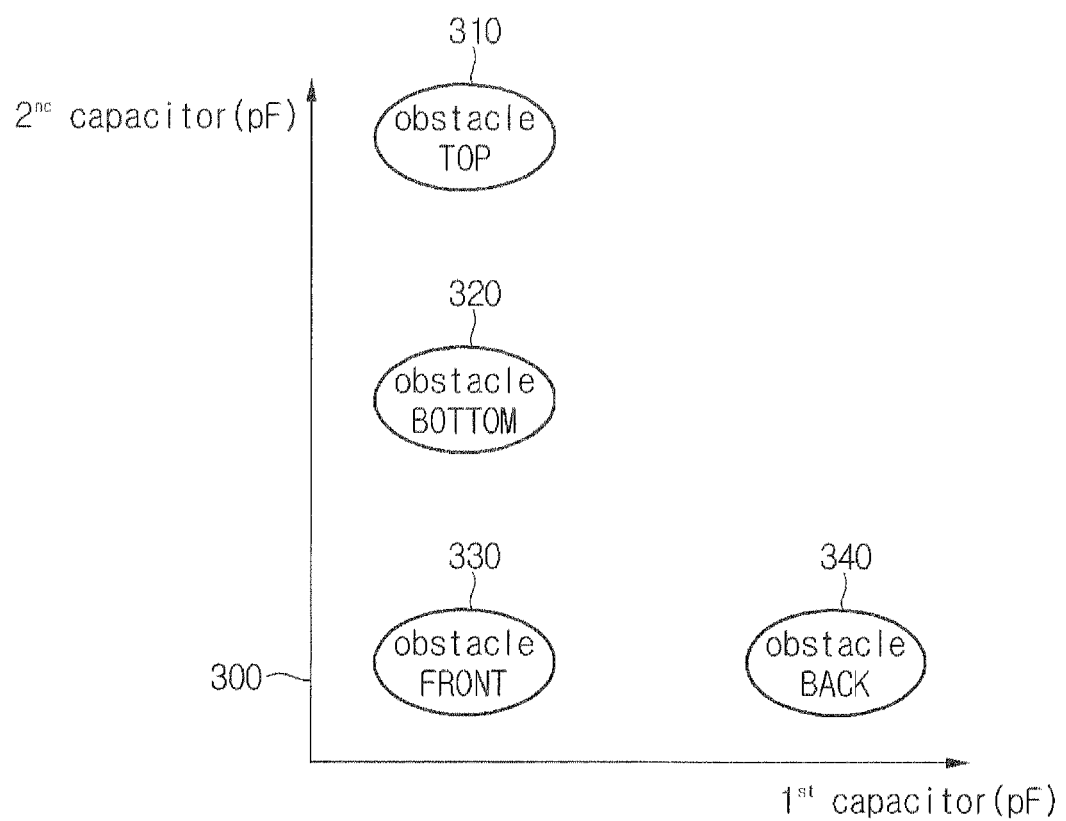

FIG. 3 is a view showing impedance matching points in the existence of an obstacle according to the embodiment.

Referring to FIG. 3, if an obstacle is placed around the impedance matching apparatus 100 in a state that the impedance matching has been achieved as shown in FIG. 2, impedance may be mismatched.

Accordingly, the impedance matching must be performed by determining an impedance matching point again in a state that the obstacle is placed. However, the impedance matching point varies depending on the position of the obstacle.

Therefore, first, a surrounding environment is set to a state that the obstacle is placed in a first position, and an impedance matching point for impedance matching is searched under the set surrounding environment.

In more detail, the impedance matching point is searched in a state that the obstacle is installed above the impedance matching apparatus 100. If the obstacle is placed above the impedance matching apparatus 100, the impedance matching point is formed in a second region 310 within a variation range 300 of the first and second variable capacitors.

After searching for the impedance matching point in the state that the obstacle is placed in the first position, surrounding environments are set to the states that obstacles are placed in second, third, and fourth positions, and impedance matching points according to the surrounding environments are sequentially searched.

After the searching operation has been finished, the impedance matching point is formed in a third region 320 when an obstacle is installed in the second position, formed in a fourth region 330 when an obstacle is installed in the third position, and formed in a fifth region 340 when an obstacle is installed in the fourth position.

After the information (information about the second to fifth regions) about the impedance matching points when the obstacles are installed at the first to fourth positions have been detected, the determined information is stored in the storage part 150.

In addition, the stored information is thereafter utilized as information used to detect the existence of an obstacle around a mobile communication terminal in a real field and the position of the obstacle.

In other words, if present impedance is mismatched, so that the impedance matching point for impedance matching is searched by the controller 160, the controller 160 compares the searched impedance matching point with information previously stored in the storage part 150, thereby determining if an obstacle exists around the mobile communication terminal.

For example, if the searched impedance matching point exists in the third region 320 within the variation range of the variable capacitors, the controller 160 may recognize that the obstacle is placed below the impedance matching apparatus 100.

Meanwhile, the controller 160 may recognize the moving direction of the obstacle or the movement direction of the impedance matching apparatus 100 by using the previously detected position of an obstacle and the presently detected position of the obstacle.

Figure 4:
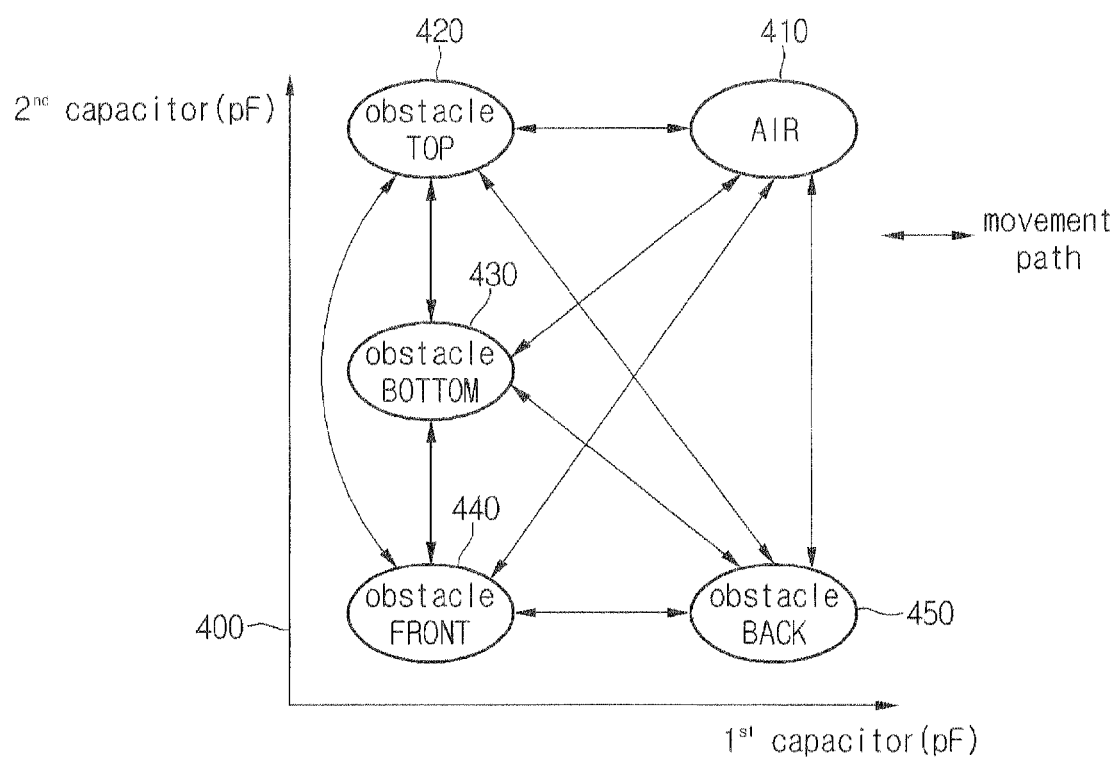

For example, when the previously detected position of the obstacle is a second region 420, and the presently detected position of the obstacle is in a fifth region 450 within a variation range 400 shown in FIG. 4, the controller 160 may recognize that the obstacle moves from above to below with respect to the impedance matching apparatus 100.

The size of the impedance matching point formed according to the state of an obstacle within the variation range of the variable capacitors may vary depending on the distance from the obstacle.

As the obstacle is placed closely to the impedance matching apparatus 100, the size of a region, in which the impedance matching point is made, is reduced within the variation range of the variable capacitors. In contrast, as the obstacle is placed away from the impedance matching apparatus 100, the size of the region, in which the impedance matching point is made, is increased.

Figure 5:
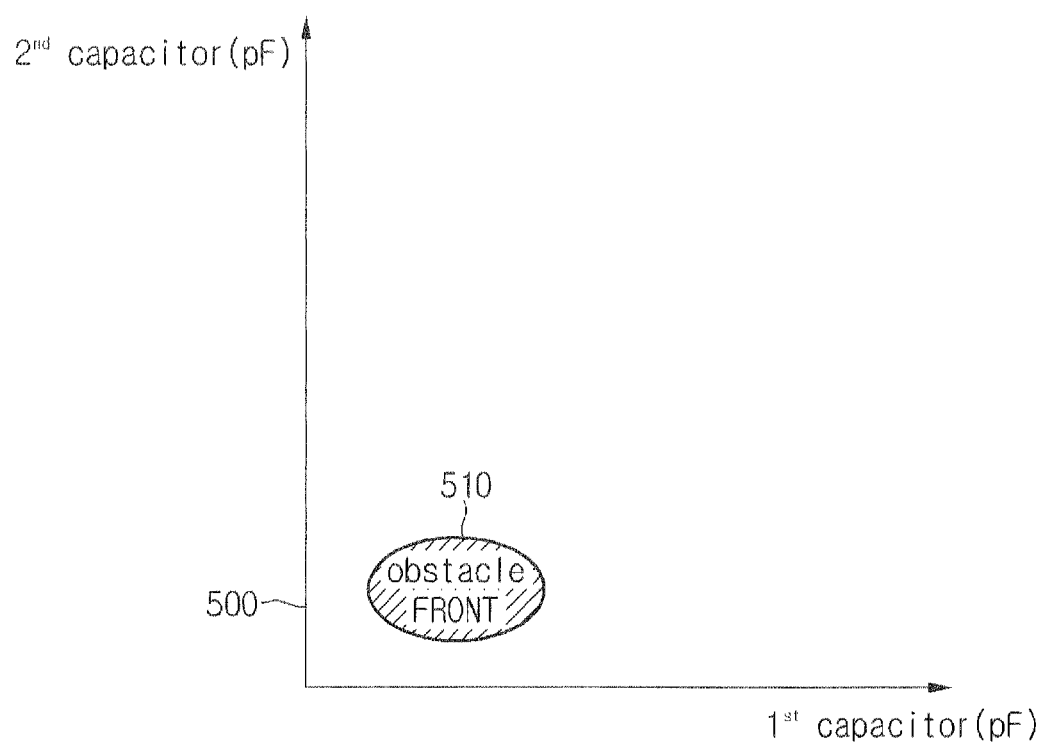

For example, as shown in FIG. 5, when the obstacle is installed at the distance of A from the third position, a region in which an impedance matching point 510 is made has a first size within a variation range 500 of the variable capacitors.

Figure 6:
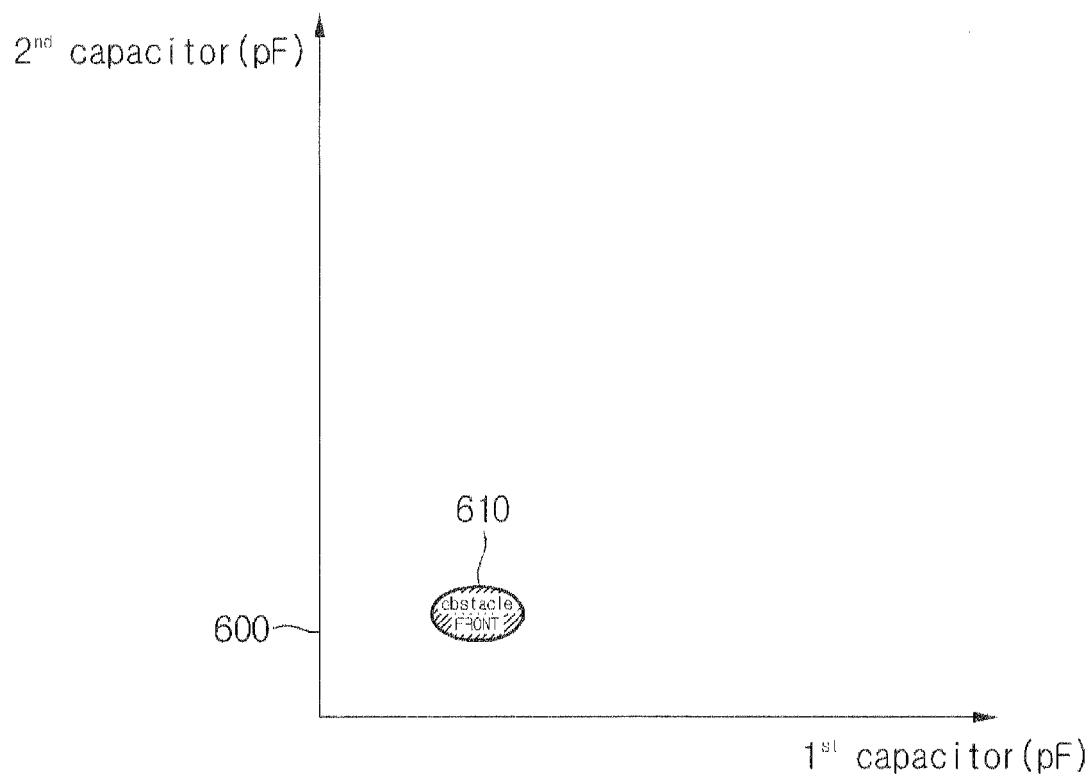

However, as shown in FIG. 6, when the obstacle is installed at the distance of B (A>B) from the third position, a region in which an impedance matching point 610 is made has a second size, which is smaller than the first size, within a variation range 600 of the variable capacitors.

Accordingly, the information about sizes of regions for the impedance matching points formed according to the distances from the obstacle is stored with the information about the impedance matching points according to the states of the obstacle. In other words, the information about the impedance matching points when an obstacle is installed at the third position may include information about positions of regions, in which the impedance matching points are formed, and information about sizes of the regions according to the distances from the obstacle.

In this case, if the region in which the impedance matching point is formed has a small size, a small number of the capacitance values of the variable capacitors allows normal impedance matching. In contrast, if the region in which the impedance matching point is formed has a large size, a large number of the capacitance values of the variable capacitors allows normal impedance matching.

Therefore, after an impedance matching point has been searched in a present state, the controller 160 compares the information about the size of the region, in which the impedance matching point is formed, with the information about the previously stored information to determine the direction in which the obstacle is positioned and the distance to the obstacle.

Figure 7:
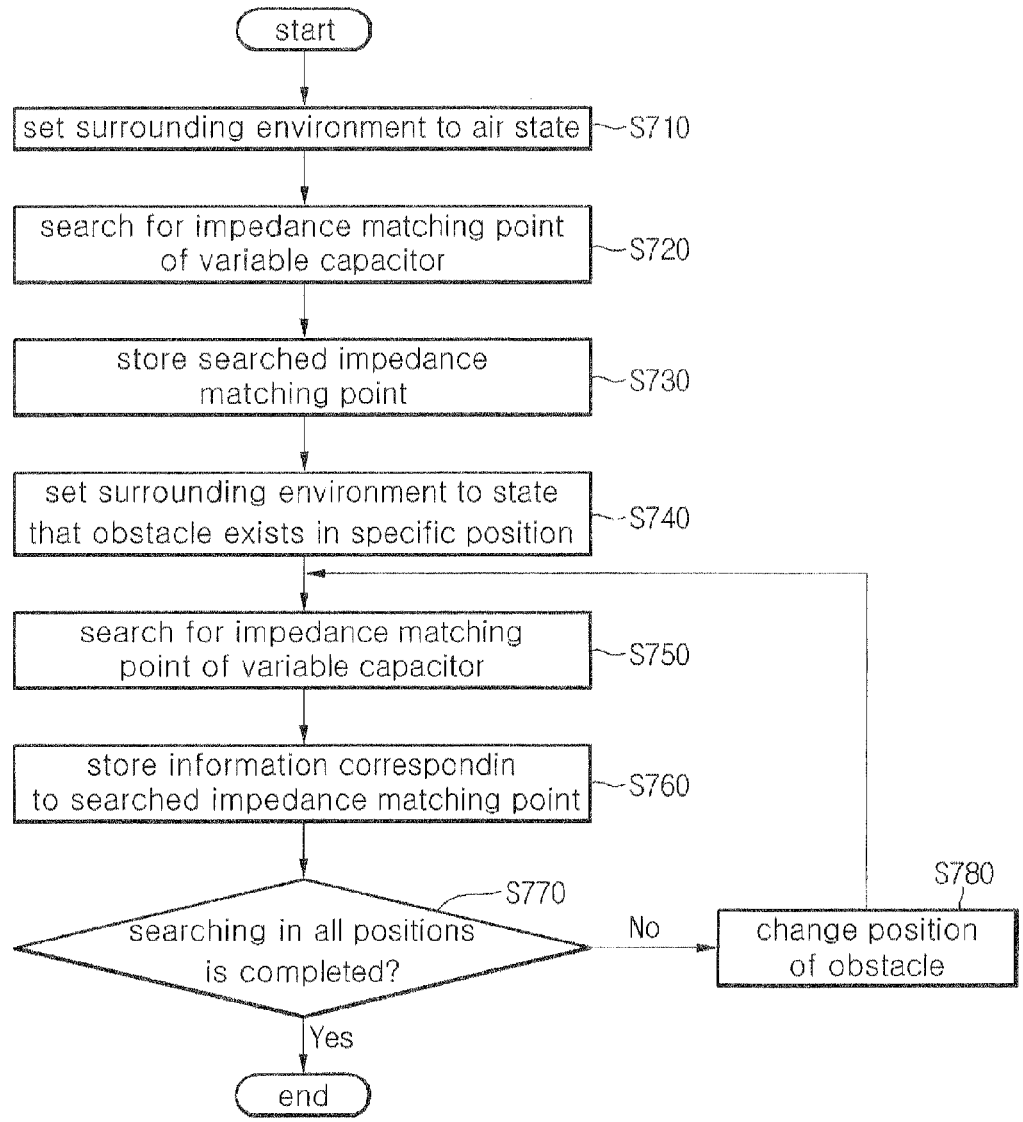
FIGS. 7 and 8 are flowcharts showing an impedance matching method of the impedance matching apparatus 100 according to the embodiment.
Figure 8:
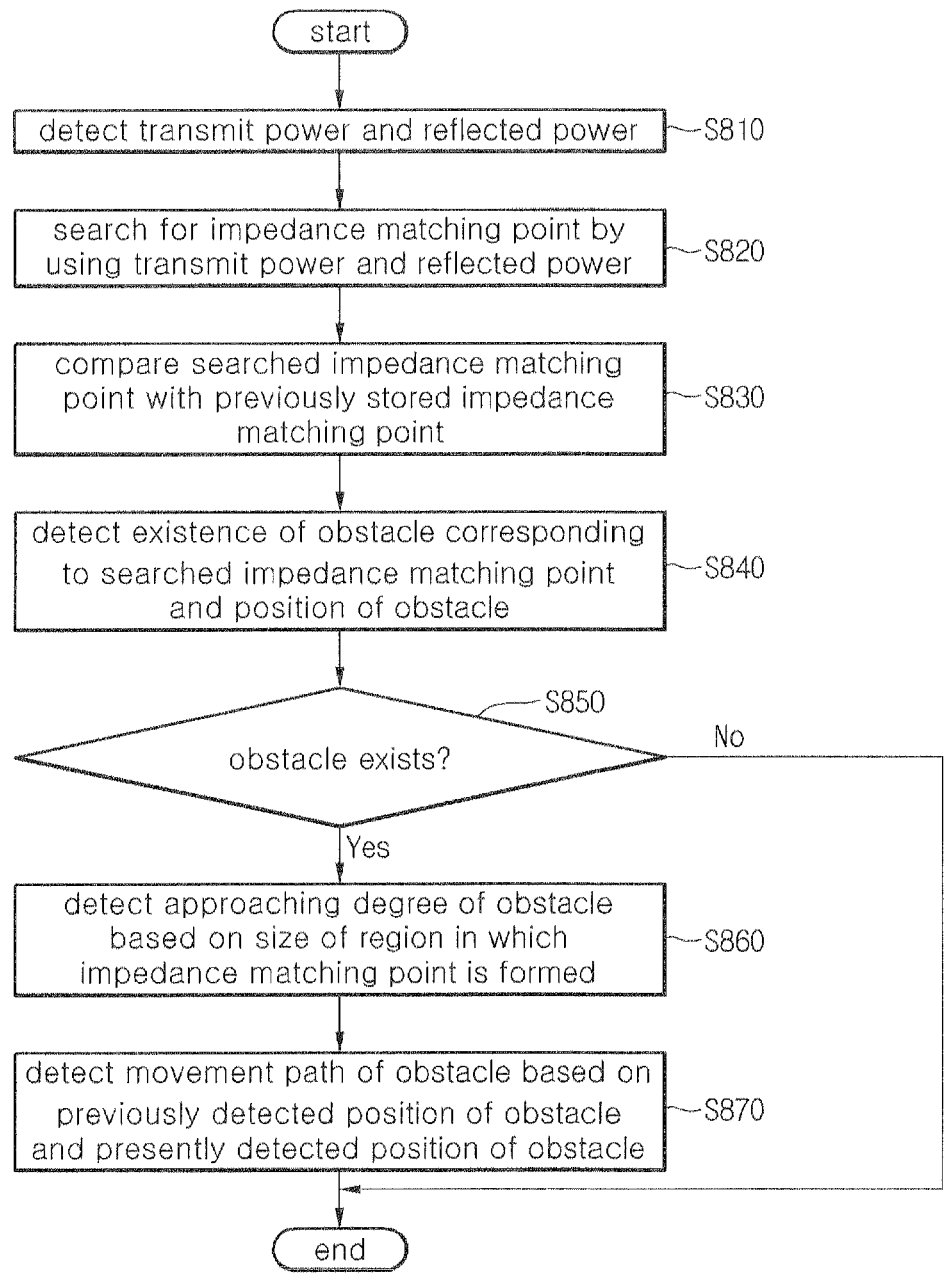

FIGS. 7 and 8 are flowcharts showing an impedance matching method of the impedance matching apparatus 100 according to the embodiment.

Referring to FIG. 7, the surrounding environment of the impedance matching apparatus 100 is set to an air state (free space state without an obstacle) (step S710).

After the surrounding environment is set to the air state, an impedance matching point is searched in the air state (step S720), and information about the searched impedance matching point is stored (step S730).

In other words, if the impedance matching apparatus 100 is placed under the surrounding environment of the air state, the capacitance values of the variable capacitors allowing the normal impedance matching are determined, and the determined capacitance values are stored.

Next, the surrounding environment is set to a state that an obstacle is installed at a specific position (step S740). To this end, the obstacle is installed in the first position. The position may be placed above the impedance matching apparatus 100.

If the surrounding environment is set to a state that the obstacle is installed at the first position, an impedance matching point allowing normal impedance matching under the surrounding environment is searched, and the information about the searched impedance matching point is stored (step S760).

In this case, the sizes of regions, in which the impedance matching points are formed, are checked according to the variation of a distance between the obstacle, which is installed at the first position, and the impedance matching apparatus 100 while continuously changing the distance.

In other words, the controller 160 stores information about an impedance matching point and information about the size of a region, in which the impedance matching point is formed, when the obstacle is installed at the distance of A from the impedance matching apparatus 100. Thereafter, the controller 160 stores information about an impedance matching point and information about the size of a region, in which the impedance matching point is formed, when the obstacle is installed at the distance of B from the impedance matching apparatus 100.

If the information about the impedance matching point under the surrounding environment in which the obstacle is installed at the first position is stored, the controller 160 determines if information about all impedance matching points for surrounding environments, in which obstacles are installed at all positions, is stored (step S770).

In other words, the controller 160 determines if all impedance matching points for surrounding environments in which obstacles are installed at the first, second, third, and fourth positions are stored.

If it is determined that information about the impedance matching points for all positions is stored (step S770), the procedure is terminated. Otherwise, after the installation position of the obstacle is changed (step S780), the step S770 returns.

In this case, the stored information about the impedance matching points according to the states of the obstacle is utilized to detect the position of the obstacle in a field thereafter.

In other words, as shown in FIG. 8, the detector 130 detects transmit power and reflected power with respect to a present surrounding environment of the impedance matching apparatus 100 (step S810).

The controller 160 searches for an impedance matching point for impedance matching by using the detected transmit power and the detected reflected power after the transmit power and the reflected power have been detected (step S820).

In other words, the controller 160 sequentially applies capacitance values existing within the variation range of the variable capacitors, and searches for an impedance matching point for impedance matching based on the transmit power and the reflected power detected by using the capacitance values.

After the impedance matching point has been searched, the controller 160 compares the information about the searched impedance matching point with the previously stored information about impedance matching points according to the obstacle states (step S830).

The controller 160 detects a present obstacle state corresponding to the searched impedance matching point based on the comparison result. To this end, the controller 160 determines if the searched impedance matching point corresponds to the previously stored information about the impedance matching point in the air state. If the searched impedance matching point corresponds to the previously stored information about the impedance matching point in the air state, the controller 160 determines that an obstacle does not exist around the impedance matching apparatus 100.

In addition, if the searched impedance matching point does not correspond to the previously stored information about the impedance matching point in the air state, the controller 160 determines the position of an obstacle corresponding to the previously stored information about the impedance matching point in the air state, and determines the position of a surrounding obstacle existing in a present state.

If the surrounding obstacle exists in the present state (Step S850), the controller 160 compares the size of a region, in which the searched impedance matching point is formed, with the previously stored information to determine the approaching degree related to the distance to the obstacle from the impedance matching apparatus 100 in the present state (step S860).

If there is information about a previously detected position of an obstacle, the controller 160 detects the movement path of the obstacle based on the information about the previously detected position of the obstacle and the information about the presently detected position of the obstacle (step S870).

Meanwhile, the impedance matching method according to the embodiment can be realized in the form of codes readable by a processor installed in a computer, which are recorded in record media readable by the processor. The record media readable by the processor include all kinds of recording devices to record data readable by the processor. The record media readable by the processor include an ROM, an RAM, a CD-ROM, a magnetic tape, a floppy disc, and an optical data storing device. In addition, the record media readable by the processor may be realized in the form of a carrier wave like transmission over the Internet. In addition, the record media readable by the processor are distributed into computer systems connected to each other over a network to store and execute codes readable by the processor through a distribution scheme.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An impedance matching apparatus comprising:
   a storage part to store information about an impedance matching point according a state of an obstacle;
   an impedance matching part connected to an antenna and including at least one variable element;
   a detector to detect transmit power and reflected power reflected by the antenna; and
   a controller to search for an impedance matching point within a variation range of the variable element by using at least one of the transmit power and the reflected power, and to detect a state of a surrounding obstacle by comparing information about the searched impedance matching point with the stored information about the impedance matching point.

2. The impedance matching apparatus of claim 1, wherein the impedance matching point includes at least one of a point representing maximum transmit power, a point representing a maximum difference between the transmit power and the reflected power, and a point representing a maximum ratio of the transmit power to the reflected power.

3. The impedance matching apparatus of claim 1, wherein the information about the impedance matching point includes information about an impedance matching point in an air state and information about an impedance matching point in existence of an obstacle, and the controller determines if the surrounding obstacle exists based on the searched impedance matching point.

4. The impedance matching apparatus of claim 1, wherein the impedance matching point information includes information about an impedance matching point in an air state and information about impedance matching points when obstacles exist in first to Nth positions, and the controller determines if the surrounding obstacle exists and detects a position of the obstacle based on the searched impedance matching point.

5. The impedance matching apparatus of claim 4, wherein the controller additionally determines a moving direction of the obstacle based on a previously detected position of the obstacle and a presently detected position of the obstacle.

6. The impedance matching apparatus of claim 4, wherein the information about the impedance matching point further includes information about a size of a region in which the impedance matching point is formed within the variation range according to an approaching degree of the obstacle, and the controller additionally determines the approaching degree of the obstacle existing in the determined position of the obstacle by using the information about the size of the region.

7. The impedance matching apparatus of claim 1, wherein the detector includes a directional coupler.

8. The impedance matching apparatus of claim 1, wherein the variable element comprises:
   a first variable capacitor connected to the antenna in series; and
   a second variable capacitor connected to the antenna in parallel.

9. The impedance matching apparatus of claim 8, wherein the impedance matching point includes capacitance values applied to the first and second capacitors.

10. An impedance matching method of an impedance matching apparatus including a variable capacitor connected to an antenna, the impedance matching method comprising:
    detecting transmit power and reflected power reflected by the antenna;
    searching for an impedance matching point of the variable capacitor by using at least one of the transmit power and the reflected power;
    comparing information about the searched impedance matching point with previously stored information about an impedance matching point according to a state of an obstacle; and
    determining a state of an obstacle positioned around the impedance matching apparatus according to the comparison result.

11. The impedance matching method of claim 10, wherein the previously stored information about the impedance matching point includes information about an impedance matching point in an air state and information about an impedance matching point in existence of an obstacle, and
    wherein the determining the state of the obstacle comprises determining if an obstacle exists around the impedance matching apparatus by using the previously stored information about the impedance matching point.

12. The impedance matching method of claim 11, wherein the information about the impedance matching point in existence of the obstacle includes information about first to Nth impedance matching points when obstacles are placed at first to Nth positions, and
    wherein the determining the state of the obstacle comprises detecting existence of an obstacle and a position of the obstacle.

13. The impedance matching method of claim 12, further comprising determining a moving direction of the obstacle with respect to the impedance matching apparatus based on a previously detected position of the obstacle and a presently detected position of the obstacle.

14. The impedance matching method of claim 12, wherein the information about the first to Nth impedance matching points further includes information about a size of a region in which the impedance matching point is formed within a variation range of the variable capacitor according to an approaching degree of an obstacle existing in a corresponding position, and
    wherein the determining the position of the obstacle comprises determining an approaching degree of the obstacle.

15. The impedance matching method of claim 10, wherein the searching for the impedance matching point comprises searching for one of a point representing maximum transmit power, a point representing a maximum difference between the transmit power and the reflected power, and a point representing a maximum ratio of the transmit power to the reflected power within a variation range of the variable capacitor.

16. A non-transitory computer-readable record medium storing an impedance matching method and recording a program to execute the impedance matching method of an impedance matching apparatus including at least one variable capacitor on a computer, wherein the impedance matching method comprises:
    detecting transmit power and reflected power reflected by the antenna;
    searching for an impedance matching point of the variable capacitor by using at least one of the transmit power and the reflected power;

comparing information about the searched impedance matching point with previously stored information about an impedance matching point according to a state of an obstacle; and determining a state of an obstacle positioned around the impedance matching apparatus according to the comparison result.

17. The non-transitory computer-readable record medium of claim 16, wherein the previously stored information about the impedance matching point includes information about an impedance matching point in an air state and information about an impedance matching point in existence of an obstacle, and wherein the determining the state of the obstacle comprises determining if an obstacle exists around the impedance matching apparatus by using the previously stored information about the impedance matching point.

18. The non-transitory computer-readable record medium of claim 17, wherein the information about the impedance matching point in existence of the obstacle includes information about first to Nth impedance matching points when obstacles are placed at first to Nth positions, and wherein the determining the state of the obstacle comprises detecting existence of an obstacle and a position of the obstacle.

19. The non-transitory computer-readable record medium of claim 18, wherein the impedance matching method further comprises determining a moving direction of the obstacle with respect to the impedance matching apparatus based on a previously detected position of the obstacle and a presently detected position of the obstacle.

20. The non-transitory computer-readable record medium of claim 18, wherein the information about the first to Nth impedance matching points further includes information about a size of a region in which the impedance matching point is formed within a variation range of the variable capacitor according to an approaching degree of an obstacle existing in a corresponding position, and wherein the determining the position of the obstacle comprises determining an approaching degree of the obstacle.

* * * * *